United States Patent [19]

Lai et al.

[11] 4,415,653

[45] Nov. 15, 1983

[54] METHOD OF MAKING SENSITIVE POSITIVE ELECTRON BEAM RESISTS

[75] Inventors: Juey H. Lai, Burnsville; Richard Douglas, Crystal, both of Minn.; Lloyd Shepherd, Eau Claire, Wis.

[73] Assignee: Honeywell Inc., Minneapolis, Minn.

[21] Appl. No.: 447,579

[22] Filed: Dec. 7, 1982

Related U.S. Application Data

[63] Continuation-in-part of Ser. No. 261,427, May 7, 1981, abandoned.

[51] Int. Cl.$^3$ .............................................. G03C 5/00
[52] U.S. Cl. .................................. 430/296; 430/326; 430/327; 430/910; 430/935; 427/43.1
[58] Field of Search ............... 430/296, 326, 327, 910, 430/935; 427/43

[56] References Cited

U.S. PATENT DOCUMENTS

| | | | |
|---|---|---|---|
| 3,538,137 | 11/1970 | Viventi | 260/448.2 |
| 3,779,806 | 12/1973 | Gipstein et al. | 427/212 |
| 3,914,462 | 10/1975 | Morishita et al. | 427/43 |
| 3,931,435 | 1/1976 | Gipstein et al. | 427/43 |
| 3,934,057 | 1/1976 | Moveau et al. | 427/43 |
| 3,935,332 | 1/1976 | Poliniak et al. | 427/43 |
| 3,940,507 | 2/1976 | Fech et al. | 427/43 |
| 3,961,099 | 6/1976 | Gipstein et al. | 427/43 |
| 3,961,101 | 6/1976 | Barton | 427/43 |
| 3,984,582 | 10/1976 | Feder et al. | 427/43 |
| 3,987,215 | 10/1976 | Cortellino | 427/43 |
| 4,004,043 | 1/1977 | Hiraoka | 430/296 |
| 4,011,351 | 3/1977 | Gipstein et al. | 427/43 |
| 4,024,293 | 5/1977 | Hatzakis | 427/43 |
| 4,087,569 | 5/1978 | Hatzakis | 427/43 |
| 4,156,745 | 5/1979 | Hatzakis et al. | 427/43 |
| 4,304,840 | 12/1981 | Helbert et al. | 430/296 |

*Primary Examiner*—Won H. Louie, Jr.
*Attorney, Agent, or Firm*—Charles G. Mersereau

[57] ABSTRACT

The method of making highly sensitive positive electron beam resists comprised of copolymers of methacrylic acid (MAA) and methacrylonitrile (MCN) is disclosed utilizing a prebaking step in which the copolymer resist in film form on the substrate is prebaked at a temperature below the decomposition temperature to improve the sensitivity of the resist. The positive electron resists produced in accordance with the present invention exhibit a high sensitivity, and high plasma etch resistance which makes them desirable for dry etching techniques in addition to other masking techniques which enable submicron resolution.

12 Claims, 2 Drawing Figures

PLASMA ETCHED OXIDE LINES (3000X)

LINE PROFILES (10,000)
AT VARIOUS EXPOSURE CHARGE DENSITIES
$Q = 1.0 \times 10^{-5}$ Ccm$^{-2}$
NO UNEXPOSED RESIST FILM THICKNESS LOSS

METHOD OF MAKING SENSITIVE POSITIVE ELECTRON BEAM RESISTS

This is a continuation-in-part of application Ser. No. 261,427 filed May 7, 1981, abandoned.

BACKGROUND OF THE INVENTION

1. Field of the Invention

The present invention relates generally to the field of radiation sensitive resist films used in microcircuit fabrication and, more particularly, to the fabrication of positive electron-beam sensitive resist films comprised of copolymers of methacrylic acid and methacrylonitrile having high sensitivity, high plasma etch resistance and submicron resolution.

2. Description of the Prior Art

The application of electron beam techniques to the art of semiconductor fabrication has enabled great strides to be made in reducing the minimum line width and thus the size of an integrated circuit pattern which can successfully be manufactured. This has been accomplished both through progress in the technology involved with the perfection in the precision of the electron beam system itself and in the progress which has been made in the technology concerned with the pattern defining medium or resist material.

In electron beam microfabrication, a substrate, which may be, for example, silicon dioxide, silicon, glass or chromium plated glass, is further coated with a layer of polymer resist material and the resist is patterned by changing the solubility of the polymer with an electron beam. Subsequently, the mask is "developed" by dissolving away the unwanted area of polymer utilizing a suitable solvent material and the resultant pattern is used as a mask either for plating, chemical etching, ion etching or ion implantation. This electron-beam lithography (EBL) is an integrated circuit production technique which utilizes a polymer resist to delineate circuit patterns for monolithic circuits.

When polymers of the required type are irradiated with an electron beam, the molecular structure is affected such that some of the polymer molecules are excited or ionized by the beam. This excitation causes some of the resist molecules to cross link with other molecules in the polymer and others to degrade or undergo scission. The predominant manner in which such a polymeric material reacts to exposure to an electron beam has led electron resists to be classified into two main categories. Thus, a polymer which becomes predominantly gelled or cross-linked, and thereby decreases its solubility after irradiation, is termed a negative resist. Conversely, if the scission process predominates and the solubility of the polymer increases after irradiation, it is called a positive resist. The resists of the present invention are positive resists.

A suitable electron resist must have various physical and chemical properties which allow it to fulfill the requirements for electron beam fabrication. The polymer material involved must be sensitive to an electron current of a fairly low value or the resist sensitivity itself will be the limiting factor on the writing speed and line width which can be achieved. The resist medium must be capable of a high resolution or resist contrast compatible with that achieved in writing and etching techniques utilizing the high resolution capability available with electron beam technology. The resist must also have the ability to adhere satisfactorily to a variety of substrates used in different microfabrication applications. The medium also must be able to withstand normal acid, base, and ion etching processes and should not be sensitive to small daily process variabilities.

In the prior art it is known to produce positive type electron resist films of comonomers of methylmethacrylate (MMA) with such monomers as acrylonitrile (AN), methacrylonitrile (MCN) and maleic anhydride. Such combinations are shown in U.S. Pat. No. 3,914,462 to Morishita et al and issued Oct. 21, 1975. Similar copolymer materials are disclosed in a patented Gipstein et al U.S. Pat. No. 4,011,351 issued Mar. 8, 1977 which discloses a method of producing a positive resist image from copolymers of alkyl mathacrylate units and polymerized units of certain other ethylenically unsaturated monomers. Those copolymers include alkyl mathacrylate units wherein the alkyl group contains from one to four carbon atoms copolymerized with ethylenically unsaturated monomers which may contain any of numerous substituted groups or multipally substituted groups. Certain other polymerized alkyl mathacrylate copolymers including polymerized monoethylenically unsaturated acid units have also been proposed in a patent to Feder et al, U.S. Pat. No. 3,984,582 issued Oct. 5, 1976.

The Feder et al patent, cited above, also discloses a prebaking step in which the prepared polymeric resist, having been coated upon a substrate by spin coating or dipping and dried to remove volatile material, is prebaked. The prebaking occurs either in air or in a vacuum at a temperature above the glass transition temperature of the polymeric material, but below the decomposition temperature of the material to remove any remaining solvent which, in the case of poly (MMA-co-MAA) is preferably in the 160° to 220° C. range. The prebaked polymeric resist is then exposed to an electron beam image and subsequently developed. The prebaking at temperatures of 160° C. to 220° C. changes the solubility of the copolymer and improves adhesion to the substrate.

The change in solubility of copolymer resists such as MMA/MAA has been found to be highly dependent on the prebaking temperature and time and is very hard to control. Therefore, the temperature and time control in the prebake step must be extremely accurate in order to maintain repeatability of resist sensitivity and resolution in the development of such resists.

A later patent, U.S. Pat. No. 4,087,569, issued May 2, 1978 to Hatzakis also discusses the prebaking of poly (MMA-co-MAA). Hatzakis emphasizes the drawback in Feder et al associated with the requirement of very precise temperature and time control in the baking of copolymer resists in film form after being coated on the work piece or substrate. He further points out that baking of a polymeric film on a work piece causes cross-linking, etc. which results in producing insoluable particles which may leave an insoluable residue on the substrate when the exposed areas are developed with a strong solvent such as ethyl cellosolve acetate (ECA).

Hatzakis, on the contrary, teaches the step of prebaking the powder form of the radiation-sensitive polymeric material poly (MMA-co-MAA) at a temperature below the decomposition temperature, prior to dissolving the copolymer in a solvent and coating it on the work piece. The copolymer resist film on the work piece may also be post-baked but only to dry the film and evaporate the coating solvent. In that patent, the baking step on the coated work piece is not utilized to change any of the properties of the polymer itself.

Thus, it can be seen from the prior art that numerous polymers including copolymers of MAA and substituted MAA esters copolymerized with various ethylenically unsaturated monomers have been proposed. In addition, various baking steps have been utilized in the preparation of resist films utilizing such copolymer combinations as MMA/MAA with varying degrees of success, and it appears that much confusion exists as to where in the process the baking step should be used.

In addtion to the requirements normally associated with prior art positive electron resists, there has been an increasing trend in integrated circuit fabrication toward the use of dry etching techniques, especially plasma etching as a method of using the developed exposed resist masks for integrated circuit fabrication. The compatibility of a resist material with the plasma etching process has therefore also become an important consideration in the selection of the resist. In the case of a positive resist, the resist material must be etch resistant such that the area of the pattern exposed to radiation are etched in preference to those not exposed.

SUMMARY OF THE INVENTION

By means of the present invention, high sensitive positive electron beam resists comprised of copolymers of methacrylic acid (MAA) and methacrylonitrile (MCN) are produced utilizing a prebaking step in which the copolymer resist in film form on the substrate is prebaked at a temperature below the decomposition temperature to improve the sensitivity of the resist. The positive electron resists produced in accordance with the present invention exhibit a high sensitivity, and high plasma etch resistance which makes them desirable for dry etching techniques in addition to other masking techniques which enables submicron resolution.

In the preferred fabrication process, a copolymer of methacrylic acid (MAA) and methacrylonitrile (MCN) is prepared by solution polymerization using a free radical initiator in a manner which produces a high molecular weight copolymer wherein $\overline{M}_w$ (weight average molecular weight) of the polymer may be $\geq 400,000$. The poly (MAA-co-MCN) produced is dissolved in a suitable solvent such as methyl cellosolve (2-methoxy ethanol) and spin-coated on a substrate such as SiO$_2$. The coated substrate is then prebaked at an elevated temperature below its decomposition temperature for the desired time, usually approximately thirty (30) minutes. Temperature of the prebake as well as the time involved depends on the relative composition of the copolymer and the subsequent resist properties desired. The prebaked resist film is then exposed to a predetermined pattern of radiation such as an electron beam and developed in a suitable developing solvent which removes the exposed area. The resist film may then be post-baked at a temperature suitable for removing the remaining developing solvent.

Thus, the poly (MAA-co-MCN) resist films produced in accordance with the present invention, in addition to being quite satisfactory for normal wet etching processes, have also been found to be excellent resists for use as the etch masks for plasma etching of such substrates as SiO$_2$ in parallel plate plasma etchers.

DESCRIPTION OF THE PREFERRED EMBODIMENT

Figure 1:
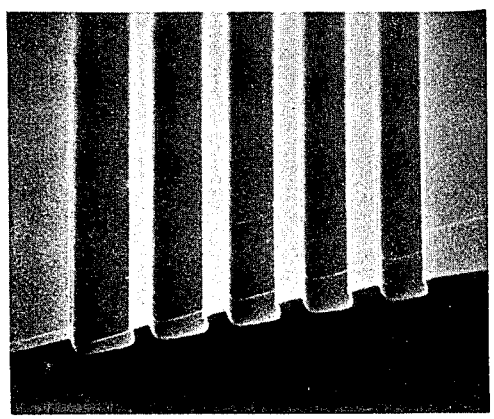
FIG. 1 is a photomicrograph (3,000X) showing resist lines of a MAA/MCN copolymer resist having a 3:1 mole ratio of MAA to MCN
Figure 1:
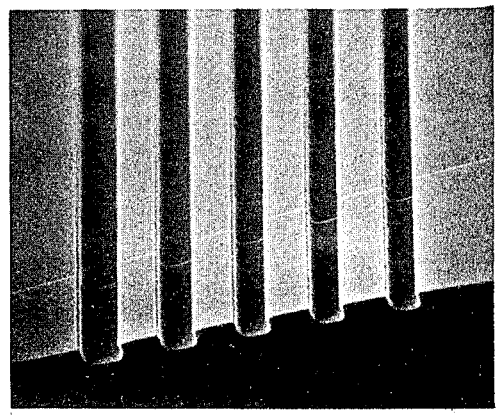
Figure 1:
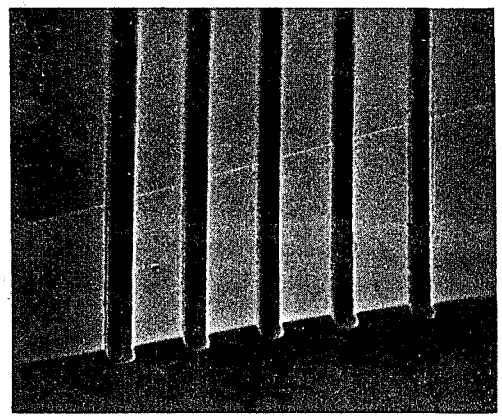

In accordance with the following examples, highly sensitive positive electron resists capable of submicron resolution are produced. The resists can be developed using wet solvent techniques but also exhibit excellent plasma etch resistance which makes them desirable for use with plasma process for etching SiO$_2$, Si$_3$N$_4$, etc. It has also been discovered with the positive electron resist of the present invention that, somewhat contrary to the teaching of the prior art, prebaking of the film of resist after application to the desired susbstrate actually enhances the desired properties and the additional cross-linking attributed to the prebaking step does not produce undesirable residues upon removal of the electron degraded material from the areas exposed to the electron beam.

POLYMER PREPARATION

The MAA/MCN copolymers were generally prepared by free-radical polymerization in solution. Because the electron resist sensitivity increases with increasing polymer molecular weight, the polymerization conditions were adjusted so that high molecular weight polymers were obtained. The preferred $\overline{M}_w$ (weight average molecular weight) of the polymers is $\geq 400,000$.

EXAMPLE I

A solution prepared from 15 ml of vacuum-distilled methacrylic acid and 15 ml of vacuum distilled methacrylonitrile dissolved in 180 ml of chlorobenzene was placed in a 250 ml, 3-neck, round-bottom flask equipped with a stirring mechanism, reflux condensor and nitrogen gas inlet. The mixture of monomer and solvent was then heated to 50° C. in the presence of flowing N$_2$ gas. A free-radical initiator consisting of 40 mg of azobisisobutyronitrile (AIBN) was then added to initiate the polymerization. The polymerization was carried out at 50° C. for 20 hours. Since the MAA/MCN polymer does not dissolve in chlorobenzene, it continuously precipitates out as it is formed. The polymer was then separated from the mixture by washing with petroleum ether and then filtered. The copolymer was dried at 50° to 60° C. at about $10^{-2}$ Torr. The yield of the polymer was about 12 gm. Elemental analysis of the copolymer indicated that it contained 22 mole percent of MCN and 78 mole percent of MAA. The intrinsic viscosity of the copolymer in methanol at 25° was 1.5.

EXAMPLE II

As in Example I, 15 ml of vacuum distilled methacrylic acid and 15 ml of vacuum distilled methacrylonitrile were dissolved in 180 ml of chlorobenzene in a 250 ml, 3-neck, round-bottom flask equipped with a stirring mechanism, reflux condensor and nitrogen gas inlet. The monomers and solvent mixture was then heated to 60° C. while N$_2$ gas was allowed to flow continuously through the flask. As in Example I, 40 mg of AIBN has then added. Polymerization conditions and procedures of this example were the same as that of Example I except that the polymerization temperature was increased to 60° C. The copolymer obtained had 25 mole percent MCN and 75 mole percent MAA. The intrinsic viscosity of the copolymer in methanol at 25° C. was 1.0.

EXAMPLE III

The method and procedure of Example I was followed with the exception that 10 ml of vacuum distilled methacrylic acid and 20 ml of methanylonitrile were used in the initial monomer solution. The copolymer obtained had 36 mole percent MCN and 64 mole percent MAA.

RESIST PREPARATION

EXAMPLE IV

A 6.0 weight/volume percent methyl cellosolve solution of a copolymer of 75 mole percent of methacrylic acid and 25 mole percent of methacrylonitrile prepared in accordance with Example II was obtained. A copolymer resist film 0.7 micron thick was obtained by spin coating the copolymer solution on a $SiO_2$ substrate at 800 rpm. The resist film was then prebaked in air (humidity 30–40%) at 160° for 30 minutes and exposed to an electron beam using a dose of $1 \times 10^{-5}$ Coulomb $cm^{-2}$ at 15 KeV. for 20 seconds. The film thickness of the unexposed area which remained after development was approximately 70% of original film thickness.

EXAMPLE V

The same copolymer resist film as described in Example IV was obtained on the surface of an $SiO_2$ substrate. The resist film was then prebaked in air (30–40% humidity) at 180° for 30 minutes and exposed using an electron dose of $1 \times 10^{-5}$ Coulomb $cm^{-2}$ at 15 KeV. The pattern was then developed by spraying with methyl cellosolve for 40 seconds. The film thickness of unexposed area after development in this case was 86% of original film thickness.

EXAMPLE VI

A 6.0 weight/volume percent methyl cellosolve solution of a copolymer of 75 mole percent of methacrylic acid and 25 mole percent of methacrylonitrile prepared in accordance with Example II was obtained. A copolymer resist film of 0.7 micron thickness was obtained by spin coating the copolymer solution on an $SiO_2$ substrate at 800 rpm. The resist film was then prebaked in air (30–40% humidity) at 200° C. for 30 minutes and exposed using an electron dose of $1 \times 10^{-5}$ Coulomb $cm^{-2}$ at 15 KeV. The pattern was then developed by spraying with methyl cellosolve for 2 minutes. The film thickness of unexposed area after development was approximately equal to 100% of original film thickness.

EXAMPLE VII

A 6.0 weight/volume percent solution of a copolymer of 78 mole percent of methacrylic acid and 22 mole percent of methacrylonitrile prepared in accordance with Example I dissolved in methyl cellosolve was obtained and filtered. A copolymer resist film 1.0 micron thick was obtained by spin coating the copolymer solution on a thermal oxide substrate at 700 rpm. After spin coating, the resist film was then prebaked in air (humidity 30–40%) at 200° C. for 30 minutes. The film was then exposed in a computer-controlled electron beam pattern generator with an exposure does of $7 \times 10^{-6}$ Coulomb $cm^{-2}$ at 15 KeV. The pattern was then developed through selective removal of the exposed area by spraying with methyl cellosolve (2-methoxy ethanol) for 3 minutes and rinsed with methyl ethyl ketone. The film thickness of the unexposed area which remained after development was approximately the same as that of the original film thickness prior to exposure. The resist film was then post-baked at 130° C. for 20 minutes in air to remove any remaining developer.

Figure 2:
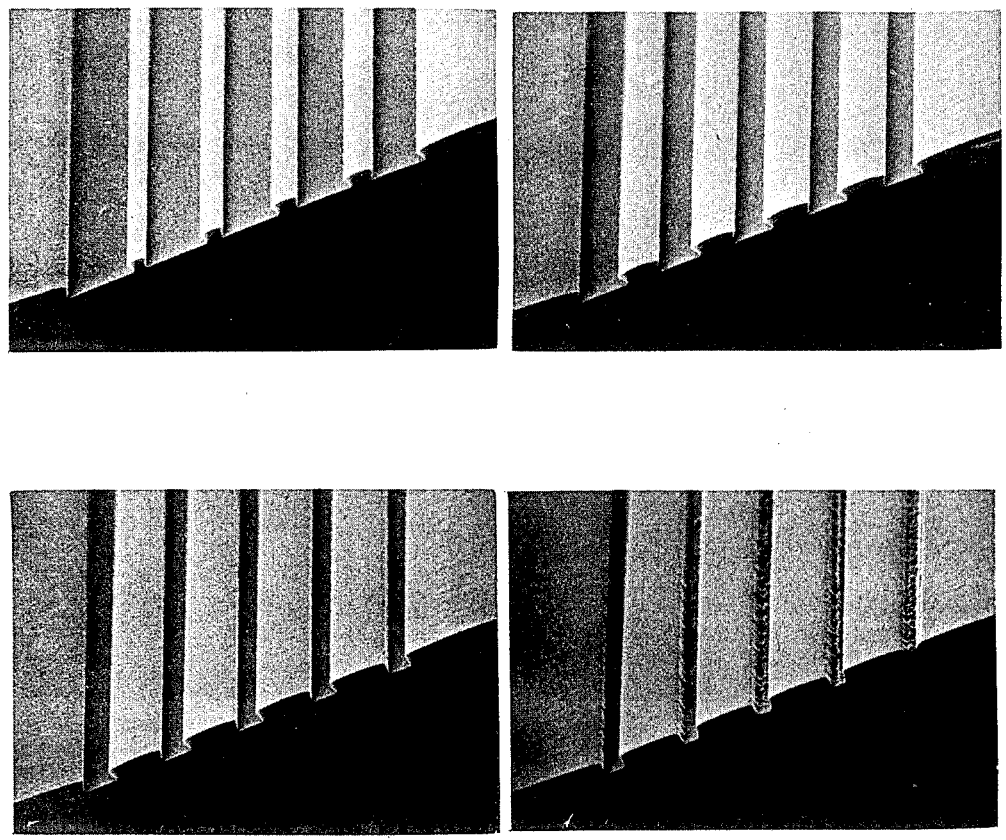
FIG. 2 is a photomicrograph (10,000X) of plasma etched one micron SiO$_2$ lines using a 3:1 MAA/MCN copolymer resist as the etch mask.

The resist film was then used as the etch mask for plasma etching of $SiO_2$ in a parallel plate plasma etcher. The observed etch rate of the polymer resist film was about half that of $SiO_2$ using $CHF_3 + 7\%$ $O_2$ as etch gases in the plasma reactor. After plasma etching, the resist film was stripped in 15 minutes using $O_2$ plasma (20 watts, 0.5 Torr) in a barrel plasma etcher. FIG. 1 shows the original 1 micron resist lines and FIG. 2 shows the 1 micron $SiO_2$ lines obtained by plasma etching in the parallel plate etcher using the copolymer resist as the etch mask.

It can be seen from the results shown in Examples IV through VII, that the temperature utilized in the prebaking step conducted after the resist polymer is spin coated on the substrate but prior to electron beam exposure has a significant effect on the resist sensitivity. This is apparent from the fact that there is no thickness loss for the films baked at 200° C. during the development step. The increase in sensitivity can be attributed to the large increase in resist molecular weight through intermolecular cross-linking induced by baking at 200° C. Contrary to the teachings of the prior art, this crosslinking is highly desirable in the case of MAA/MCN positive resists. It has been found that the intrinsic viscosity of the 3:1 MAA/MCN copolymer DMF (demethylformamide) 25° C. was found to be increased from 2.0 to 14.0 after baking for 30 minutes at 200° C. This is an indication of significant increase in resist molecular weight. Also, the dissolution rate of the resist film baked at 200° C. was found to decrease significantly. Hence, the baked resist can be developed longer without dissolving unexposed resist film which results in an increase in resist sensitivity. It should be noted that prebaking of from 10 minutes to 30 minutes may be satisfactory developing on the exact polymer composition and prebaking temperature and the requirements of the resist.

It is apparent also that the developer is one of the important components in resist processing. A proper developer can enhance the sensitivity and the resolution and could minimize resist swelling and cracking. Of the many developers tried, methyl cellosolve (2-methoxy ethanol) was found to be the most satisfactory for the poly (MAA-co-MCN) resist. The micrograph of FIG. 1 also illustrates that the 3:1 MAA/MCN copolymer resist is capable of very high resolution, i.e. less than or equal to 1.0 micron with vertical pattern walls.

As previously discussed, a recent trend in integrated circuit fabrication is the increased use of dry etching techniques, especially plasma etching. The compatibility of a resist material with the plasma etching process, therefore, is increasingly becoming a requirement for submicron circuit fabrication. A copolymer resist of the present invention has been found to be compatible with the plasma process for etching $SiO_2$ and silicon. The photo micrograph shown in FIG. 2 illustrates the one micron $SiO_2$ lines obtained by plasma etching in a parallel-plate etcher using the 3:1 MAA/MCN copolymer resist in the etching process. The plasma etch rate of the resist, both in a parallel-plate etcher ($C_2F_6/O_2$ plasma) and in the barrel etcher ($CF_4/O_2$ plasma) is about a factor of two less than that of previous resist films such as PMMA (poly methylmethacrylate).

In addition to the examples cited above, it has been found that most generally the mole percent MAA should predominate in the polymer resists of the present invention, resists having from about 50 mole percent methyacrylic acid to about 95 percent methyacrylic acid and from about 50 percent mole percent to about 5 mole percent methacrylonitrile can be successfully used. The electron beam resist of the present invention can also be coded on any suitable substrate which is compatible with the process of developing an etching sought to be utilized. Thus, in addition to $SiO_2$, GaAS, $Si_3N_4$, silicon in certain metals and other commonly used substrates may be employed.

Also, other developing solvents such as ethyl cellosolve and ethanol have been found to work satisfactorily with the resists of the present invention although methyl cellosolve is the preferred developing solvent. Other well-known wet etching processes may be employed in utilizing the resist film as the etch mask if a dry plasma etch is not the desired way of fabricating the particular microcircuit involved.

While the exposure of the resist of the present invention has been specifically described with regard to the use of an electron beam, it is contemplated that other forms of ionizing radiation can be used and would occur to those skilled in the art. These include x-ray, ion beam, and deep UV.

The embodiments of the invention in which an exclusive property or right is claimed are defined as follows:

1. A method of producing a sensitive positive resist image comprising the steps of
    coating a substrate with a solution of a radiation sensitive copolymer comprising methacrylic acid and methacrylonitrile to form a thin polymeric film of said copolymer thereon;
    prebaking the coated substrate at a temperature below the decomposition temperature of said copolymer;
    exposing said polymeric film to ionizing radiation in a predetermined pattern to increase the solubility of the exposed areas thereof; and
    developing said polymeric film to remove said copolymer from said exposed areas.

2. The method according to claim 1 wherein said prebaking temperature is between 160° C. and the decomposition temperature of said polymer.

3. The method according to claim 1 wherein the weight average molecular weight of said copolymer is equal to or greater than 400,000.

4. The method according to claim 1 wherein said copolymer comprises from about 50 to 95 mole percent of methacrylic acid and from about 50 mole percent to about 5 mole percent methacrylonitrile.

5. The method according to claim 1 wherein said prebaking temperature is 200° C.

6. The method according to claim 2 wherein said prebaking step is carried out at said prebaking temperature from about 10 minutes to about 60 minutes.

7. The method according to claim 1 wherein said exposed copolymer film is developed by washing said exposed film and said substrate with methyl cellosolve.

8. The method according to claim 1 wherein said ionizing radiation is electron beam radiation.

9. The method according to claim 1 wherein said copolymer is prepared by solution polymerization using a free-radical initiator and obtained by precipitation from said solution.

10. The method according to claim 3 wherein said copolymer is prepared by solution polymerization using a free-radical initiator and obtained by precipitation from said solution.

11. The method according to claim 4 wherein said copolymer is prepared by solution polymerization using a free-radical initiator obtained by precipitation from said solution.

12. The method according to claim 1 wherein said coating is formed by spin coating and the solvent for the coating solution is methyl cellosolve.

* * * * *